United States Patent [19]
Inaba et al.

[11] 3,993,808  
[45] Nov. 23, 1976

[54] METHOD FOR ELECTROLESS PLATING GOLD DIRECTLY ON TUNGSTEN OR MOLYBDENUM

[75] Inventors: Yoshiharu Inaba; Toru Kawanobe, both of Kodaira, Japan

[73] Assignee: Hitachi, Ltd., Japan

[22] Filed: Feb. 4, 1975

[21] Appl. No.: 546,923

Related U.S. Application Data

[63] Continuation-in-part of Ser. No. 280,120, Aug. 14, 1972, abandoned.

[30] Foreign Application Priority Data

| Aug. 13, 1971 | Japan | 46-61059 |
| Aug. 13, 1971 | Japan | 46-61060 |
| Aug. 13, 1971 | Japan | 46-61061 |

[52] U.S. Cl. .............................. 427/377; 427/89; 427/92; 427/98; 427/437; 106/1; 427/383 C

[51] Int. Cl.² .......................................... C23C 3/00

[58] Field of Search .............. 427/96, 92, 98, 89, 427/436, 437, 377, 383; 106/1

[56] References Cited

UNITED STATES PATENTS

| 3,162,512 | 12/1964 | Robinson | 427/98 X |
| 3,230,098 | 1/1968 | Robinson | 427/437 X |
| 3,266,929 | 8/1966 | Lareau et al. | 427/437 X |
| 3,396,042 | 8/1968 | Duva | 427/436 |
| 3,589,916 | 6/1971 | McCormack | 427/437 |
| 3,664,868 | 5/1972 | Davis et al. | 427/96 |

*Primary Examiner*—Ralph S. Kendall  
*Attorney, Agent, or Firm*—Craig & Antonelli

[57] ABSTRACT

Gold is directly plated onto tungsten or molybdenum by an electroless plating process using a plating solution including a gold compound and having pH not less than 8, and desirably not less than 9.

26 Claims, 5 Drawing Figures

METHOD FOR ELECTROLESS PLATING GOLD DIRECTLY ON TUNGSTEN OR MOLYBDENUM

CROSS REFERENCE TO RELATED APPLICATION

This application is a continuation-in-part of application Ser. No. 280,120 filed on Aug. 14, 1972, now abandoned.

The present invention relates to a method for coating a thin gold layer, e.g. a film directly on a metal body of tungsten or molybdenum by an electroless chemical plating process.

Usually, in the manufacture of ceramic packages and ceramic substrates with printed interconnections for semiconductor integrated circuits, the conductive portions which are applied for connecting or wiring metallic parts together have been made by coating powders of tungsten or molybdenum on the ceramic surface and then by sintering the powders. The conductive portions are usually further coated with gold films in order to improve the connector properties to external connector elements. As the process for providing gold coatings to the conductive portions, there have been an electroplating process and a chemical or electroless plating process. Generally, it has been said that it is not possible to obtain gold plated layers having good contact characteristics to the substance thereunder without employing the electroplating process since it is very difficult to chemically plate gold directly to tungsten or molybdenum. On the other hand, since the conductive portions of the ceramic packages and the printed ceramic substrates are separated from each other so as to provide circuit or wiring constructions, the electroplating process needs extremely complicated apparatus for taking out the variously separated conductive portions with a single common electrode. Therefore, the application of the chemical plating process to form gold films has been recently considered since this process does not need such complicated apparatus. However, the usual chemical plating process has the disadvantages that the plated gold film does not contact well with the tungsten or molybdenum where gold is plated directly thereon and that the plating speed is extremely slow. For example, when a plating solution of pH=7 having the following composition is used at a temperature of 90° C., the plating speed or rate of gold deposition is about 0.8 micron/hr.

The composition of the above-mentioned plating solution:

| | | |
|---|---|---|
| Gold potassium cyanide | KAu(CN)$_2$ | 5gr/l |
| Nickel chloride | NiCl$_2$ . 6 H$_2$O | 5gr/l |
| | EDTA . 2Na | 50gr/l |
| Ammonium chloride | NH$_4$Cl | 30gr/l | wherein EDTA designates ethylenediaminetetraacetic acid.

An object of the present invention is to provide an improved gold plating method for providing a gold film directly onto a substance or body consisting mainly of tungsten or molybdenum by a chemical plating process, wherein the gold film has a good adherence characteristic to the substance thereunder and the plating speed or rate of gold is remarkably increased.

The essential feature of the present invention comprises chemically plating gold directly onto a sintered body consisting substantially of tungsten powders, molybdenum powders or a mixture thereof or onto a metallic body consisting substantially, i.e. predominantly, of tungsten, molybdenum or a mixture thereof, e.g. an alloy, by using a gold plating solution having a hydrogen ion exponent or concentration, i.e. pH of not less than 8 , and more desirably of not less than 9 , and a temperature ranging from about 55° C. to the boiling point thereof.

The gold plating solution is an aqueous solution containing water soluble gold compounds such as gold potassium cyanide, i.e. KAu(CN)$_2$; chloroauric acid, i.e. HAuCl$_4$; potassium tetrachloroaurate, i.e. KAuCl$_4$; sodium tetrachloroaurate, i.e. NaAuCl$_4$ and the like. Preferably, the water-soluble gold compounds are compounds containing cyanide ions, e.g. KAu(CN)$_2$, NaAu(CN)$_2$, LiAu(CN)$_2$, and the like because these compounds readily dissociate and because the gold adherence characteristics and the gold plating rate are substantially improved in the presence of complexing cyano salts of Zn and Ni and in some cases Co and Cu. These salts are obtained from the corresponding halides such as ZnCl$_2$, NiCl$_2$, etc. Usually the range of concentration of the gold compound in the plating solution is from about 1 to about 100 gram per liter.

The method of this invention will be further understood from the following detailed description and the accompanying drawings wherein.

Figure 1:
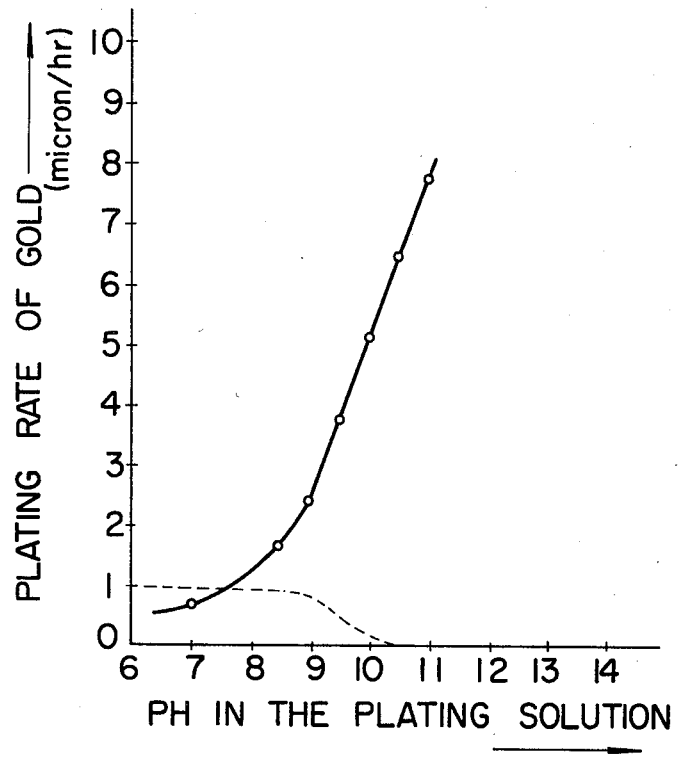
FIG. 1 shows a graph of the relationship between pH of the solution and the gold plating rate.

The plating method according to the present invention will now be explained in detail.

At first, a body of tungsten, molybdenum or an alloy thereof such as, for example, tungsten-molybdenum, tungsten-manganese, or molybdenum-manganese is prepared as the substrate. It may be provided with a metallic plate itself of the material or with a metallic film of the material coated on another metallic plate. Otherwise, it may provided with a metallic sintered body formed by printing the powders of tungsten or molybdenum on an insulating substrate having a high thermal stability such as a ceramic substrate and then by sintering the combination at an elevated temperature, for example, 1200° C.

A plating solution containing a water-soluble gold compound or gold ions is added with ammonium hydroxide (NH$_4$OH) or a caustic alkali such as NaOH or KOH in order to adjust or control the value of the hydrogen exponent, i.e. the pH, so as to make the solution alkaline.

In this electroless gold plating reaction, gold ions in the plating solution are reduced according to the following reaction:

$$Au^+ + e \rightarrow Au \qquad (1)$$

and the equilibrium electrode potential of this reaction at 25° C, is as follows;

$$E = 1.691 + 0.059 \log a\,(\text{Au}^+) \qquad (2)$$

Whereas tungsten dissolves on the basis of the following equations;

$$W + 8OH^- \rightarrow WO_4^{--} + 4H_2O + 6e \qquad (3)$$

and the equilibrium electrode potential of this reaction is as follows:

$$E = 0.049 - 0.0788\,\text{pH} - 0.0098 \log a\,(WO_4^{--}) \qquad (4)$$

In case of molybdenum it dissolves as follows:
$$Mo + 8OH^- \rightarrow MoO_4^{--} + 4H_2O + 6e \qquad (5)$$

and the equilibrium electrode potential of this reaction is as follows:

$$E = 0.154 - 0.0788\,\text{pH} + 0.0098 \log a\,(MoO_4^{--}) \qquad (6)$$

wherein the unit of potential is volt v. s. N.H.E. (Normal Hydrogen Electrode).

As seen from the above equations (2) and (4) or (6), it is understood that as the value of pH becomes larger, the dissolving potential of tungsten or molybdenum becomes less-noble and the driving force in he displacement reaction becomes larger with a result that the plating speed or rate of gold becomes larger.

The following examples further illustrate the invention:

EXAMPLE 1

At first the metal (the substance on which gold is to be plated) consisting substantially of tungsten or molybdenum is pretreated and activated in a first solution as follows:

The first aqueous solution in case the metal consists substantially of tungsten consists of:

| | | |
|---|---|---|
| 30% $H_2O_2$ | | 50 gr/l |
| NaOH | | 50 gr/l | at a room temperature for 10 minutes.

The first aqueous solution in case the metal consists substantially of molybdenum consists of:

| | | |
|---|---|---|
| $K_3Fe(CN)_6$ | | 100 gr/l |
| KOH | | 50 gr/l | at a temperature of 60° C. for 10 minutes.

Then the metal is washed or cleaned in water and is subjected to a chemical plating treatment in the following gold plating solution (the aqueous second solution) with addition of a proper amount of ammonia water to make the value of pH into a predetermined one.

| | | |
|---|---|---|
| Potassium gold cyanide | $KAu(CN)_2$ | 5 gr/l |
| Nickel chloride | $NiCl_2 \cdot 6\,H_2O$ | 5 gr/l |
| Sodium citrate | $Na_3C_6H_5O_7 \cdot 2H_2O$ | 100 gr/l | at a temperature of about 90° C.

In FIG. 1, the relationship between the pH of the resulting solution and the gold plating rate is shown, wherein solid line shows the relationship in the case where gold is directly plated onto tungsten, while for the sake of comparison the broken line shows one in the case that gold is indirectly plated onto tungsten through a nickel layer.

As clearly understood from the drawing, the case gold is directly plated on tungsten the plating rate of gold is apt to increase as the pH becomes larger than 7, while it is apt to decrease in case gold is indirectly plated on tungsten through nickel. Especially, it will be understood that in case gold is directly plated on tungsten, the plating rate at pH 10 is about 7 times as large as one at pH 7, and that it is desirable to use the plating solution having pH not less than 8 in order to obtain a plating rate more than 1 micron/hr, and further that it is desirable to use the plating solution having pH not less than 9 in order to obtain a plating rate more than 2 microns/hr.

EXAMPLE 2

After the metal of tungsten or molybdenum was pretreated and washed in water as described in Example 1, it is subjected to a chemical plating treatment in the following gold plating solution with different additions of caustic alkali sufficient to make the solution alkaline.

| | | |
|---|---|---|
| Gold potassium cyanide | $KAu(CN)_2$ | 5 gr/l |
| Nickel chloride | $NiCl_2 \cdot 6\,H_2O$ | 5 gr/l |
| | EDTA . 2NA | 50 gr/l | at a temperature of 90° C.

From this experiment, it is found that the gold plating rate of about 4 microns/hr can be obtained by using the solution of pH 10, while only 0.3 micron/hr is obtained by using the solution of pH 7 at a temperature of 90° C.

EXAMPLE 3

After the metal of molybdenum or tungsten was pretreated and washed in water as described in Example 1, it is subjected to a chemical plating treatment in the following gold plating solution to which proper amounts of ammonium hydroxide ($NH_4OH$) are added so as to make the solution alkaline.

| | | |
|---|---|---|
| Gold potassium cyanide | $KAu(CN)_2$ | 5 gr/l |
| Zinc chloride | $ZnCl_2$ | 10 gr/l |
| Sodium citrate | $Na_3C_6H_5O_7$ | 100 gr/l | at a temperature of 90° C.

From this experiment, it is found that the gold plating rate of 2 microns/hr is obtained by using the plating solution having pH 10, while 0.3 micron/hr is obtained by pH 7.

It is to be noted that in the present examples with the addition of a buffer agent such as $NH_4Cl$ adjusting the value of pH is not always necessry in the present plating solutions. If any buffer agent is not added therein, it is desirable to always control or continuously adjust the value of pH during the plating process.

As understood from the foregoing examples, it is noted that according to the present invention, the increase of gold plating rate by 2 to 8 times can be obtained by adding ammonium water, i.e. ammonium hydroxide, or caustic alkali to a gold plating solution so as to obtain pH not less than 8, desirably not less than 9.

Furthermore, the plated gold films according to the present invention are further improved in adherence characteristic to molybdenum or tungsten thereunder by subjecting the combination to a heat treatment at a temperature of 700° C. or more and since the films do not react with molybdenum and tungsten the films provide soft surface thereon. Therefore, the plated gold films are remarkably suitable to bond silver, aluminum or gold wires thereto by thermocompression or ultrasonic bonding techniques or to connect other metallic portions thereto through silver solder or through eutectic alloys of gold-silicon, where the films are used as conductive portions provided on ceramic substrates. Generally, the gold films are heat treated at temperatures of from 700° to 1,500° C. and desirably from 700° to 1,100° C. in an atmosphere except an oxidizing atmosphere, that is, in the atmosphere such as $N_2$, Ar, Ne, etc.

EXAMPLE 4

A method of manufacturing a ceramic printed package for packaging an integrated semiconductor circuit device therein with a plurality of conductive means is explained in detail with reference to FIG. 2:

a. First, a plurality of green ceramic sheets 1, 2 and 3 which are comprised mainly of alumina, for example, about 90 weight % (about 3 weight % MgO and 6 to 7 weight % silicon dioxide) and which are not yet sintered are prepared. A conductive and pasty paint is prepared by mixing metallic powders having particle size of about 0.5 micron or less and consisting mainly of tungsten such as powders of tungsten-nickel (containing about 10% manganese) with a binder of ethyl-cellulose (1–3%) using a solvent of butyl-carbitol-acetate (11–15%). Then the conductive paint is coated on predetermined portions of the ceramic sheets by printing techniques, thereby conductive layers for providing later interconnection layers are formed.

b. The laminated ceramic sheets 1, 2 and 3 are sintered by heating them to a temperature of 1,500° C. for 30 minutes in a forming gas atmosphere ($H_2$: $N_2$ =1:9). In this step, the conductive layers are also simultaneously sintered, thereby tungsten metalized layers 6a, 6b, 6c and 6d having a thickness of about 10 microns which adhere mechanically and firmly to the ceramic substrates 1, 2 and 3 can be obtained. Since in this step tungsten oxides are formed on the surfaces of the metallized layers, the oxide layers are removed by immersing into a solution, wherein 100 grams of $K_3Fe(CN)_6$ and 100 grams of KOH are mixed into 1 liter of water, at a temperature of 60° C. for 2 to 5 minutes or a solution having a composition of $HNO_3$: HF:$H_2O$ =1:1:1 parts by volume at a room temperature for 30 seconds, and then the layers are washed in pure water.

c. Then the metallized layers are subjected to be exposed in a gold plating solution as mentioned before for a predetermined time so as to form gold layers 7a, 7b, 7c and 7d with a thickness of about 2 microns only onto the metallized portions 6a, 6b, 6c and 6d.

The following gold plating solution (as well as ones stated in Examples 1 to 3) may be applied:

| | | |
|---|---|---|
| $KAu(CN)_2$ | 5 gr/l | |
| $NiCl_2 \cdot 6 H_2O$ | 5 gr/l | |
| EDTA | 5 gr/l | | pH = 9 (adjusted with ammonia water)

d. Then a plurality of external metal leads 8a and 8b are connected to the conductive portions coated with gold through silver solder 9a and 9b at a temperature of 800° C. to 900° C. The silver solder consists mainly of silver-copper alloy (72% Ag, 28% Cu) and includes a small amount (about 3 ppm) of phosphorus, cadmium or zinc. It has a melting point of about 700° C. Thus a ceramic package is obtained.

In the last step (d), the plated gold films are mechanically and firmly fixed to the metallic layers by the heat at a temperature more than 700° C., thereby the external leads are also strongly fixed thereto.

Figure 2:
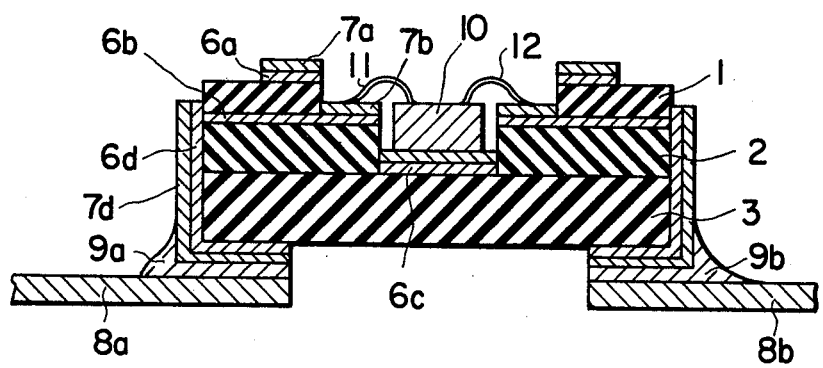
FIG. 2 shows a cross sectional view of a ceramic package with gold films plated by the method of the present invention.

In FIG. 2, numeral 10 illustrates a semiconductor integrated circuit device comprising a silicon substrate which is fixed with the metallized layer 6c through gold-silicon eutectic alloy, and numerals 11 and 12 illustrate gold or silver wires which electrically connect the semiconductor circuit elements fromed in the silicon substrate with the plated gold layers 7b.

EXAMPLE 5

After the metal of tungsten or molybdenum was pretreated and washed in a water as described in Example 1, it is subjected to a chemical plating treatment in the following gold plating solution to which proper amounts of ammonium hydroxide ($NH_4OH$) are added so as to make the solution alkaline.

| | | |
|---|---|---|
| Gold potassium cyanide | $KAu(CN)_2$ | 5 gr/l |
| Ammonium chloride | $NH_4Cl$ | 50 gr/l |
| Zinc chloride | $ZnCl_2$ | 20 gr/l | at a temperature of about 90° C.

Figure 3:
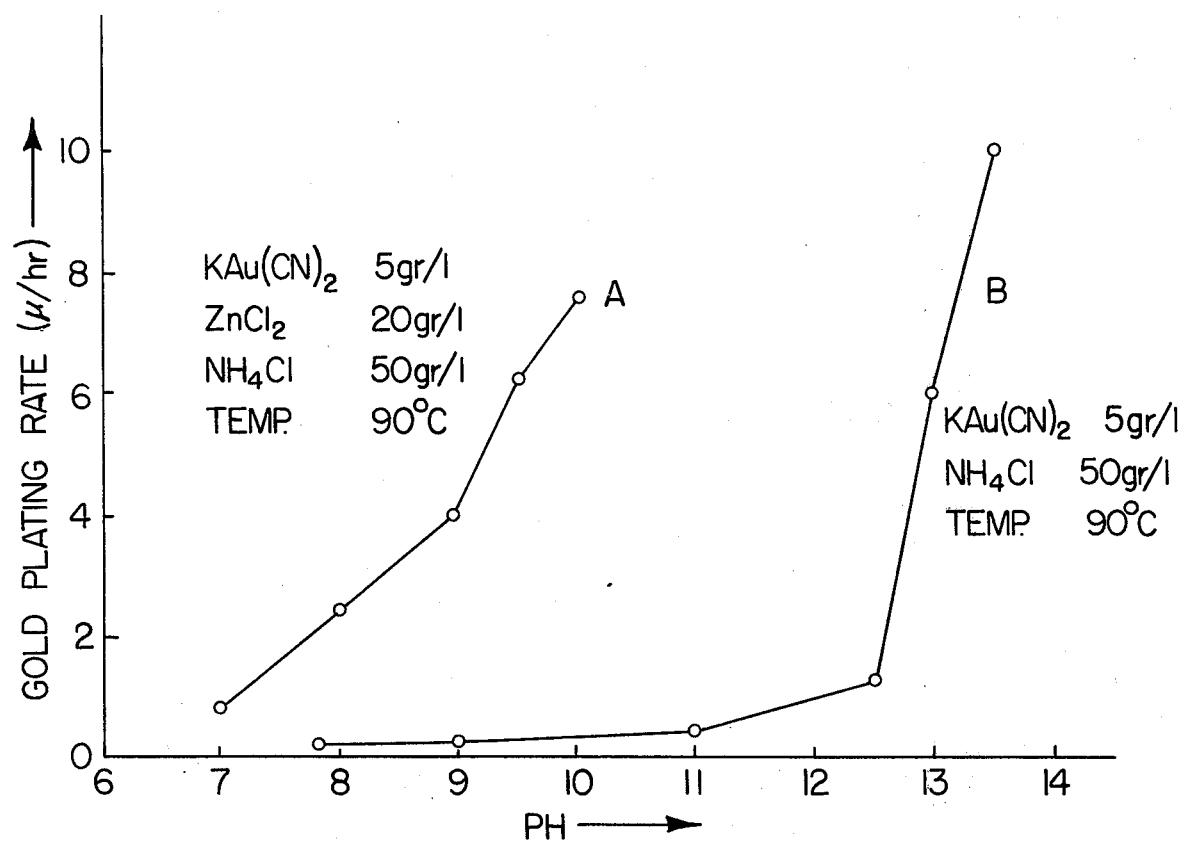
FIG. 3 shows the relationship between the pH of the gold plating solution containing ZnCl$_2$ and the gold plating rate.

In FIG. 3, the relationship between the pH of the resulting solution and the gold plating rate is shown by reference A. Reference B in FIG. 3 which is added for the purpose of comparing with the present embodiment, shows the relationship in case of using a solution consisting of potassium gold cyanide [$KAu(CN)_2$]5 gr/1 and ammonium chloride ($NH_4Cl$) 50 gr/1, at a temperature of about 90° C., to which proper amounts of caustic soda (NaOH) are added so as to make the solution alkaline.

As a result of comparing reference A with B, it is clearly understood that in case zinc chloride is added to the solution, the plating rate of gold is remarkably increased as the pH becomes larger than 7.

Particularly, it will be noted that the gold plating rate of about 2.2$\mu$/hr. at pH 8, about 4$\mu$/hr. at pH 9 and about 7.5$\mu$/hr. at pH 10 can be obtained at a temperature of about 90° C.

EXAMPLE 6

After the metal of tungsten or molybdenum was pretreated and washed in a water as described in Example 1, it is subjected to a chemical plating treatment in the following gold plating solution to which proper amounts of ammonium hydroxide ($NH_4OH$) are added so as to make the solution pH 8.5.

| | | |
|---|---|---|
| Gold potassium cyanide | $KAu(CN)_2$ | 5 gr/l |
| Ammonium chloride | $NH_4Cl$ | 30 gr/l |
| Zinc chloride | $ZnCl_2$ | 0–40 gr/l | at a temperature of about 90° C.

Figure 4:
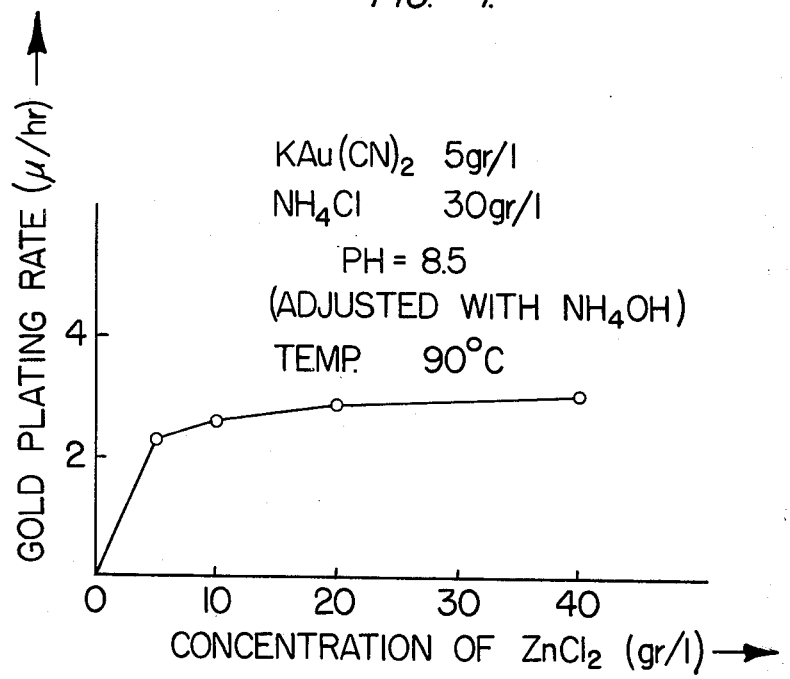
FIGS. 4 and 5 show the relationship between the concentration of zinc chloride and the gold plating rate for a solution containing ammonium hydroxide and sodium hydroxide respectively.

In FIG. 4, the relationship between the concentration of zinc chloride ($ZnCl_2$) and the gold plating rate is shown. As understood from the drawing, the gold plating rate depends hardly on the concentration of zinc chloride as the concentration of zinc chloride becomes larger than 10 gr/l.

EXAMPLE 7

After the metal of tungsten or molybdenum was pretreated and washed in a water as described in Example 1, it is subjected to a chemical plating treatment in the following gold plating solution to which proper amounts of caustic soda (NaOH) are added so as to make the solution pH 8.5

| Gold potassium cyanide | $KAu(CN)_2$ | 5 gr/l |
|---|---|---|
| Ammonium chloride | $NH_4Cl$ | 100 gr/l |
| Zinc chloride | $ZnCl_2$ | 0–20 gr/l | at a temperature of about 90° C.

Figure 5:
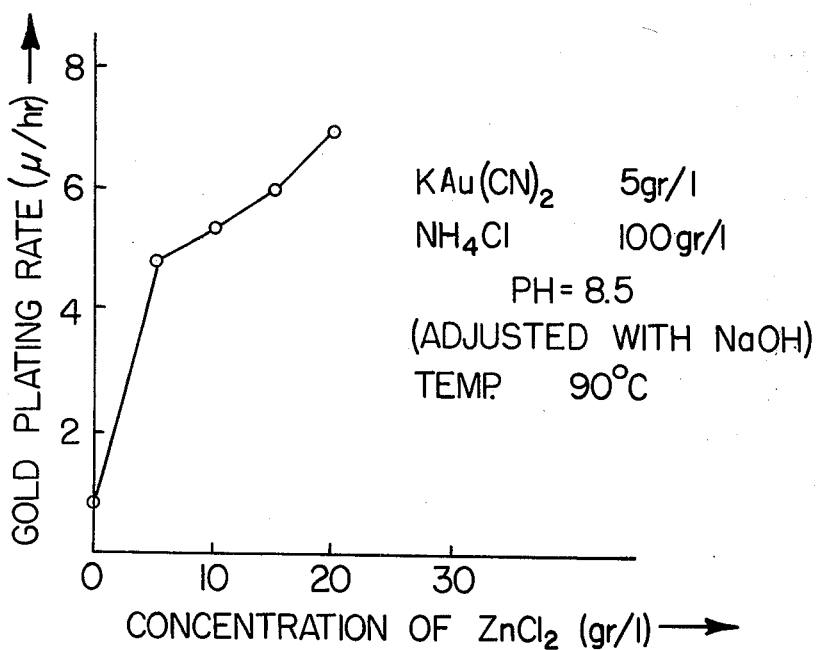

FIG. 5 shows the relationship between the concentration of zinc chloride ($ZnCl_2$) and the gold plating rate. In case caustic soda (NaOH) is used as a pH adjuster in comparison with Example 6, the gold plating rate is increased as the concentration of zinc chloride increases.

As a result of experimenting the gold plating treatment, it has been found that the gold plating layer obtained in low pH solution has good adherence characteristics to tungsten or molybdenum as compared with that obtained in high pH solutions. Accordingly, it is desirable to perform the gold plating treatment in relatively low pH solution i.e. from 8 to 10. Ammonium hydroxide ($NH_4OH$) as the pH adjuster does not produce the solution with a relatively high pH since it has the nature that it is apt to vaporize as the pH of the solution becomes high.

The solution containing large amounts of ammonium radical ($NH_4$) has the same tendency as described above. The operation of the gold plating treatment according to the present invention is explained as follows:

Gold potassium cyanide [$KAu(CN)_2$] is dissociated as the following reaction:

$$KAu(CN)_2 \rightleftarrows K^+ + Au(CN)_2^- \ldots \quad (1)$$

wherein $Au(CN)_2^-$ is dissociated as follows:

$$Au(CN)_2^- \rightleftarrows Au^- + 2CN^- \ldots \quad (2)$$

wherein $Au^+$ is reacted with $e^-$ and changed to Au as follows:

$$Au^+ + e^- \rightarrow Au^° \ldots \quad (3)$$

With such reactions (1), (2) and (3), Au ° or Au film can be obtained.

On the other hand, in the above treatment, cyano or cyanide ions ($CN^-$) in equation (2) are made free state in the solution and they prevent a production of $Au^+$ in equation (2).

As a result, the gold plating rate is lowered. However, according to the present invention, due to an existence of complex salts such as $Zn(CN)_4^{2-}$, $Ni(CN)_4^{2-}$, etc. which are produced from $ZnCl_2$, $NiCl_2$, respectively and are capable of reacting with the above free cyano ions ($CN^-$), the cyano ions are changed from ions to complex salts such as $Zn(CN)_4^{2-}$, $Ni(CN)_4^{2-}$, etc. as the following reaction:

$$Zn^{++} + 4CN^- \rightleftarrows Zn(CN)_4^{2-}$$

$$Ni^{++} + 4CN^- \rightleftarrows Ni(CN)_4^{2-}$$

As a result, an effect by the cyano ions is eliminated.

In FIG. 5, it should be noted that in case caustic soda (NaOH) as pH adjuster is used, the gold plating rate is increased as compared with FIG. 4, since the solution in FIG. 5 does not contain large amounts of ammonium radical ($NH_4$) in comparison with FIG. 4.

Ammonium chloride ($NH_4Cl$) in FIG. 5 is used in order to prevent a production of caustic zinc [$Zn(OH)_2$] since in case the solution contains only alkaline material, it is apt to produce caustic zinc [$Zn(OH)_2$] which lowers the gold plating rate.

In the present invention, complex salts such as $Co(CN)_6^{4-}$ and $Cu(CN)_2^-$ which are produced from $Co(CN)_2$ and $Cu(CN)_2$ or $Cu(CN)$, as well as $Zn(CN)_4^{2-}$ and $Ni(CN)_4^{2-}$ may be used. $Co(CN)_6^{4-}$ and $Cu(CN)_2^-$ are produced as follows:

$$Co^{++} + 6CN^- \rightleftarrows Co(CN)_6^{4-}$$

$$Cu^+ + 2CN^- \rightleftarrows Cu(CN)_2^-$$

As described above, it will be understood that according to the present invention, gold can be easily, economically and firmly plated directly on molybdenum or tungsten without providing any intermediate layer such as a nickel layer on the molybdenum or tungsten.

Furthermore, it should be noted that although the metallized layers may include platinum, the plating process according to the present invention can always achieve the objects and the remarkable advantages as mentioned above without such expensive platinum.

It will be understood from the above examples that the substrate to be coated in accordance with this invention must include tungsten or molybdenum in an amount not less than 60 weight % and that manganese and nickel may be included to a maximum of 40 weight % and 10 weight %, respectively. Also, these substrates may contain a maximum of about 5 weight % of silicon dioxide, titanium, chromium, aluminum, iron or cobalt.

Furthermore, it will be appreciated that the upper limit for the pH of the gold plating solution is dependent on the alkaline material added. Generally, in the case of ammonium hydroxide, the upper pH is about 12. However, since it has been ascertained that $NH_4OH$ can hardly dissociate at a pH over 10, the preferred upper pH limit for $NH_4OH$ is a pH of 10. In the case of a caustic alkali such as caustic soda or caustic potash, a pH up to about 14 may be used to increase the gold plating rate. However, it has been found that at a higher pH, i.e. above 12, good adherence between the gold and the tungsten or molybdenum-containing substrates is not obtained with either NaOH or $NH_4OH$. Therefore, the preferred upper pH limit for NaOH or $NH_4OH$ is not more than 10. The use of ammonium hydroxide ($NH_4OH$) above as the pH adjuster is much preferred since, as heretofore mentioned, $NH_4OH$ tends to vaporize as the pH increases, thereby maintaining the preferred low pH. Also, it will be recognized that EDTA or sodium citrate is used in the plating solution to complex nickel or zinc ions in the plating solutions whereby the nickel or zinc ions are stabilized. In this regard, it has been found that the range of concentrations for nickel chloride, zinc chloride or EDTA in the gold plating solution is from 0 to about 100 grams per liter. Respectively; for sodium citrate, 0 to 500 grams per liter, and for the buffering agent, not more than 5 mole per liter. The preferred concentration for zinc chloride or nickel chloride is from 5 to 20 grams per liter. Exemplary buffering agents are sodium phosphate, i.e. $Na_2HPO_4$; sodium borate, i.e. $Na_2B_4O_7$; and sodium carborate, i.e. $Na_2CO_9$.

Also, the temperature of the plating solution may vary from about 55° C. to the boiling point of the solution, desirably the temperature is from about 70° to 95° C.

It will be further appreciated that pretreatment of the metal substrates prior to gold plating is needed to remove oxides of molybdenum or tungsten therefrom. Also, the composition of solution used for this pretreatment (i.e. the first solution) is generally not considered critical in the present invention and solutions other than those described may be used. For example, NaOH solutions may be employed for this purpose. If the surface of the metal substrate is clean a solution of NaOH may be used only to degrease for the pretreatment.

While the novel principles of the invention have been described, it will be understood that various omissions, modifications and changes in these principles may be made by one skilled in the art without departing from the spirit and scope of the invention.

What is claimed is:

1. A method for electroless plating gold directly on a metal comprising the steps of preparing a metallic body made up substantially of an element selected from the group consisting of tungsten and molybdenum, preparing an aqueous plating solution including a water soluble gold compounds and an alkaline material consisting of ammonium hydroxide and having a pH not less than 8 and not more than 12, and directly exposing a surface of said metallic body to said plating solution to plate gold directly on the surface of said metallic body; said gold compound being a complex cyanide salt and the plating solution containing a water-soluble salt of Zn or Ni capable of forming a cyanide complex with cyano groups obtained from said gold compound.

2. The method according to claim 1, wherein said metallic body is a sintered body of powders of said metallic element.

3. The method according to claim 1, wherein the pH of said plating solution is not more than 10.

4. The method according to claim 1, wherein said gold compound is gold potassium cyanide and the water-soluble salt is zinc chloride or nickel chloride.

5. The method according to claim 1, wherein said plating solution comprises about 3 to 20 grams/liter of $KAu(CN)_2$; about 2 to 20 grams/liter of $NiCl_2$ and about 50 to 200 grams/liter of $Na_3C_6H_5O_7$, and ammonium hydroxide.

6. The method according to claim 1, wherein said plating solution comprises about 3 to 20 grams/liter of $KAu(CN)_2$; about 5 to 20 grams/liter of $ZnCl_2$; about 10 to 50 grams/liter of $Na_3C_6H_5O_7$ and ammonium hydroxide.

7. The method according to claim 4, wherein said plating solution includes gold potassium cyanide in an amount ranging from about 3 to 30 grams/liter.

8. The method according to claim 1, wherein the concentration of the gold compound in said plating solution ranges from about 1 to about 100 grams per liter.

9. The method according to claim 1, wherein the temperature of said plating solution ranges from about 55° C. to the boiling temperature thereof.

10. The method according to claim 1, wherein the temperature of the plating solution is from 70° to 95° C.

11. The method of claim 1, wherein the gold plated surface of the metallic body is subjected to a heat treatment at temperatures of from 700° to 1,500° C. in a gas atmosphere except an oxidizing atmosphere to improve the adherence of the gold to said metallic surface.

12. The method according to claim 1, wherein the metallic body is made substantially of tungsten.

13. A method for electrodes plating gold directly on a metal comprising the steps of preparing a metallic body made up of substantially of an element selected from the group consisting of tungsten and molybdenum, preparing an aqueous plating solution including gold, potassium cyanide, zinc chloride, ammonium chloride and ammonium hydroxide, and having a pH not less than 8 and more than 10, and directly exposing a surface of said metallic body to said plating solution to plate gold directly on the surface of said metallic body.

14. The method according to claim 13, wherein the concentration of the zinc chloride in said plating solution ranges from about 10 to 40 grams per liter.

15. A method for electroless plating gold directly on a metal comprising the steps of preparing a metallic body comprised of at least 60% by weight of a metal selected from a group consisting of tungsten and molybdenum, preparing an aqueous plating solution consisting essentially of water, a water-soluble gold compound, an alkaline material selected from the group consisting of ammonium hydroxide and sodium hydroxide, a water-soluble salt of nickel or zinc, and at least one compound selected from a group consisting of ammonium chloride, a sodium salt of ethylenediaminetetraacetic acid, and sodium citrate, said solution having a pH not less than 8 and not more than 12, and directly exposing a surface of said metallic body to said plating solution to plate gold directly on the surface of said metallic body.

16. The method according to claim 15, wherein said metallic body is a sintered body of powders of said metal.

17. The method according to claim 15, wherein the pH of said plating solution is not more than 10.

18. The method according to claim 15, wherein the gold compound is a complex cyanide salt and the water-soluble salt of zinc or nickel is capable of forming a cyanide complex with cyano groups obtained from said gold compound.

19. The method according to claim 18, wherein said gold compound is gold potassium cyanide and the water-soluble salt of zinc or nickel is zinc chloride or nickel chloride.

20. The method according to claim 15, wherein the alkaline material is ammonium hydroxide.

21. The method according to claim 15, wherein the alkaline material is sodium hydroxide.

22. The method according to claim 15, wherein said plating solution comprises about 3 to 20 grams/liter of $KAu(CN)_2$; about 2 to 20 grams/liter of $NiCl_2$ and about 5 to 20 grams/liter of $EDTA:2Na$ and sodium hydroxide.

23. The method according to claim 1, wherein said metallic body consists essentially of tungsten, molybdenum or a mixture thereof.

24. The method according to claim 1, wherein said metallic body contains tungsten or molybdenum in an amount not less than 60 weight %, a maximum of 40 weight % of manganese, a maximum of 10 weight % of nickel and a maximum of about 5 weight % of silicon dioxide, titanium, chromium, alluminum, iron or cobalt.

25. The method according to claim 8, wherein said plating solution contains from 0 to about 100 grams/liter of nickel chloride, zinc chloride or EDTA, from 0 to 500 grams/liter of sodium citrate and not more than 5 mole/liter of a buffering agent.

26. The method of claim 15, wherein said plating solution contains from 1 to 100 grams/liter of said gold compound, from 0 to 100 grams/liter of nickel chloride, zinc chloride or EDTA, from 0 to 500 grams/liter of sodium citrate and not more than 5 mole/liter of ammonium chloride.

* * * * *